(12) United States Patent
Sheng et al.

(10) Patent No.: US 6,900,650 B1
(45) Date of Patent: *May 31, 2005

(54) SYSTEM AND METHOD FOR CONTROLLING TEMPERATURE DURING BURN-IN

(75) Inventors: Eric Chen-Li Sheng, San Jose, CA (US); David H. Hoffman, Sunnyvale, CA (US); John Laurence Niven, Livermore, CA (US)

(73) Assignee: Transmeta Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/791,459

(22) Filed: Mar. 1, 2004

(51) Int. Cl.[7] .............................................. G01R 31/02
(52) U.S. Cl. ........................................................ 324/760
(58) Field of Search ................................ 324/754, 758, 324/760; 327/534, 538–539, 68

(56) References Cited

U.S. PATENT DOCUMENTS

| | | | | |
|---|---|---|---|---|
| 5,119,337 A | * | 6/1992 | Shimizu et al. .............. 365/201 |
| 5,406,212 A | * | 4/1995 | Hashinaga et al. .......... 324/760 |
| 5,844,429 A | * | 12/1998 | Cho .............................. 327/68 |
| 6,035,407 A | | 3/2000 | Gebara et al. ............... 713/300 |
| 6,037,792 A | * | 3/2000 | McClure ...................... 324/760 |
| 6,100,751 A | * | 8/2000 | De et al. ..................... 327/534 |
| 6,104,061 A | * | 8/2000 | Forbes et al. ............... 257/330 |
| 6,114,866 A | * | 9/2000 | Matsuo et al. .............. 324/760 |
| 6,137,301 A | * | 10/2000 | Chen ........................... 324/760 |
| 6,157,201 A | * | 12/2000 | Leung, Jr. ................... 324/760 |
| 6,218,892 B1 | * | 4/2001 | Soumyanath et al. ....... 327/537 |
| 6,262,588 B1 | * | 7/2001 | Chen ........................... 324/765 |
| 6,310,485 B1 | * | 10/2001 | McClure ...................... 324/760 |

\* cited by examiner

*Primary Examiner*—David Zarneke
*Assistant Examiner*—Jermele Hollington
(74) *Attorney, Agent, or Firm*—Wagner, Murabito & Hao LLP

(57) ABSTRACT

Systems and methods for reducing temperature dissipation during burn-in testing are described. Devices under test are each subject to a body bias voltage. The body bias voltage can be used to control junction temperature (e.g., temperature measured at the device under test). The body bias voltage applied to each device under test can be adjusted device-by-device to achieve essentially the same junction temperature at each device.

21 Claims, 4 Drawing Sheets

SYSTEM AND METHOD FOR CONTROLLING TEMPERATURE DURING BURN-IN

RELATED UNITED STATES PATENT APPLICATIONS

This application is related to U.S. patent application Ser. No. 10/791,241 by E. Sheng et al., filed on Mar. 1, 2004, entitled "System and Method for Reducing Heat Dissipation During Burn-In," assigned to the assignee of the present invention, and hereby incorporated by reference in its entirety.

This application is related to U.S. patent application Ser. No. 10/791,099 by E. Sheng et al., filed on Mar. 1, 2004, entitled "System and Method for Reducing Temperature Variation During Burn-In," assigned to the assignee of the present invention, and hereby incorporated by reference in its entirety.

BACKGROUND OF THE INVENTION

1. Field of the Invention

Embodiments of the present invention relate to burn-in of semiconductor devices.

2. Related Art

Semiconductor devices (e.g., microprocessors) are screened for defects by performing burn-in operations that subject the devices to test conditions including an elevated temperature test condition. However, due to variations in burn-in power, ambient temperature, air flow and heat sink performance, all devices under test may not experience the same temperature during testing.

Variation in the wafer fabrication process is a primary cause of variation in burn-in power. Fabrication process variations can cause leakage current to differ from one part to another by as much as 100 percent. While leakage current from a chip is proportional to the number of transistors on the chip, leakage current is inversely proportional to the critical dimension of the transistors. Increasing the number of transistors and decreasing the size of the transistors, which are currently accelerating trends in chip making, aggravate the situation. A solution that can ameliorate problems caused by variations in burn-in power would be advantageous.

SUMMARY OF THE INVENTION

Therefore, a system and/or method for controlling temperature during burn-in, so that all devices experience essentially the same temperature during burn-in, would be valuable.

Accordingly, systems and methods for controlling temperature during burn-in testing are disclosed. In one embodiment, devices under test are each subject to a body bias voltage. The body bias voltage can be used to control "junction temperature" (e.g., temperature measured at the device under test). The body bias voltage applied to each device under test can be adjusted device-by-device to achieve essentially the same junction temperature at each device.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION OF THE INVENTION

Figure 1:
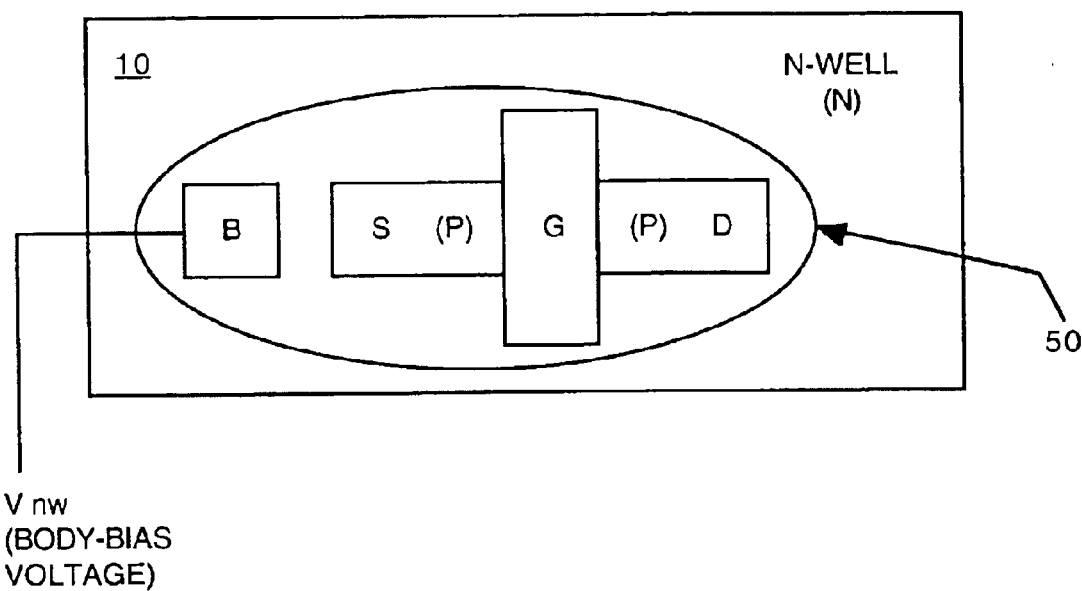
FIG. 1 illustrates a top view of a positive-channel field effect transistor (pFET) formed in an N-well in accordance with an embodiment of the present invention.

Reference will now be made in detail to the various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. A procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, bytes, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "applying," "selecting," "measuring," "adjustng," "regulating," "accessing" or the like, refer to the action and processes (e.g., flowchart 400 of FIG. 4) of a computer system or similar intelligent electronic computing device, that manipulates and transforms data represented as physical (electronic) quantities within the computer system's registers and memories into other data similarly represented as physical quantities within the computer system memories or registers or other such information storage, transmission or display devices.

The following description of embodiments of the present invention describes coupling a body bias voltage to positive-channel field effect transistors (pFETs) or p-type metal-oxide semiconductor field effect transistors (p-type MOSFETS) formed in surface N-wells via a conductive sub-surface region of n-type doping when a p-type substrate and an N-well process are utilized. However, embodiments in accordance with the present invention are equally applicable to coupling a body bias voltage to negative-channel FETs (nFETs) or n-type MOSFETS formed in surface P-wells via a conductive sub-surface region of p-type doping when an n-type substrate and a P-well process are utilized. Consequently, embodiments in accordance with the present invention are well suited to semiconductors formed with and in either p-type or n-type materials.

FIG. 1 illustrates a top view of a pFET 50 (or p-type MOSFET) formed in an N-well 10 when a p-type substrate and an N-well process are utilized in accordance with one embodiment of the present invention. The N-well 10 has an n-type doping. Regions of a semiconductor device that are doped with an n-type dopant have one type of conductivity while regions that are doped with a p-type dopant have another type of conductivity. Typically, various dopant concentrations are utilized in different regions of the semiconductor device.

In the present embodiment, the pFET 50 has a body bias voltage Vnw applied to its bulk or body terminal B. As depicted in FIG. 1, the pFET 50 has gate G, drain D (p-type doping), source S (p-type doping), and bulk/body terminal B. In particular, the bulk/body terminal B is coupled to the N-well 10. Hence, a voltage applied to the bulk/body terminal B is received by the N-well 10. In the case of body biasing, the bulk/body terminal B receives a body bias voltage Vnw. Thus, the body bias voltage Vnw is applied to the N-well 10.

The pFET 50 is body biased to influence its performance. Without body biasing, the source S and bulk/body terminal B are coupled together. With body biasing, the source S and bulk/body terminal B are not coupled together. Body biasing enables the potential difference between the source S and bulk/body terminal B of the pFET 50 to be controlled, thereby providing the ability to control the threshold voltage level of the pFET 50. Other parameters, such as the leakage current associated with pFET 50, can also thereby be controlled. Increasing threshold voltage decreases leakage current. Thus, body biasing to increase threshold voltage can be used to decrease leakage current.

Burn-in operations to detect defects in integrated circuit are generally performed at stressing temperatures (e.g., 150 degrees Celsius), stressing voltage (e.g., 1.5 times nominal operating voltage), and at low operating frequencies (usually orders of magnitude slower than normal operating frequencies).

Figure 2:
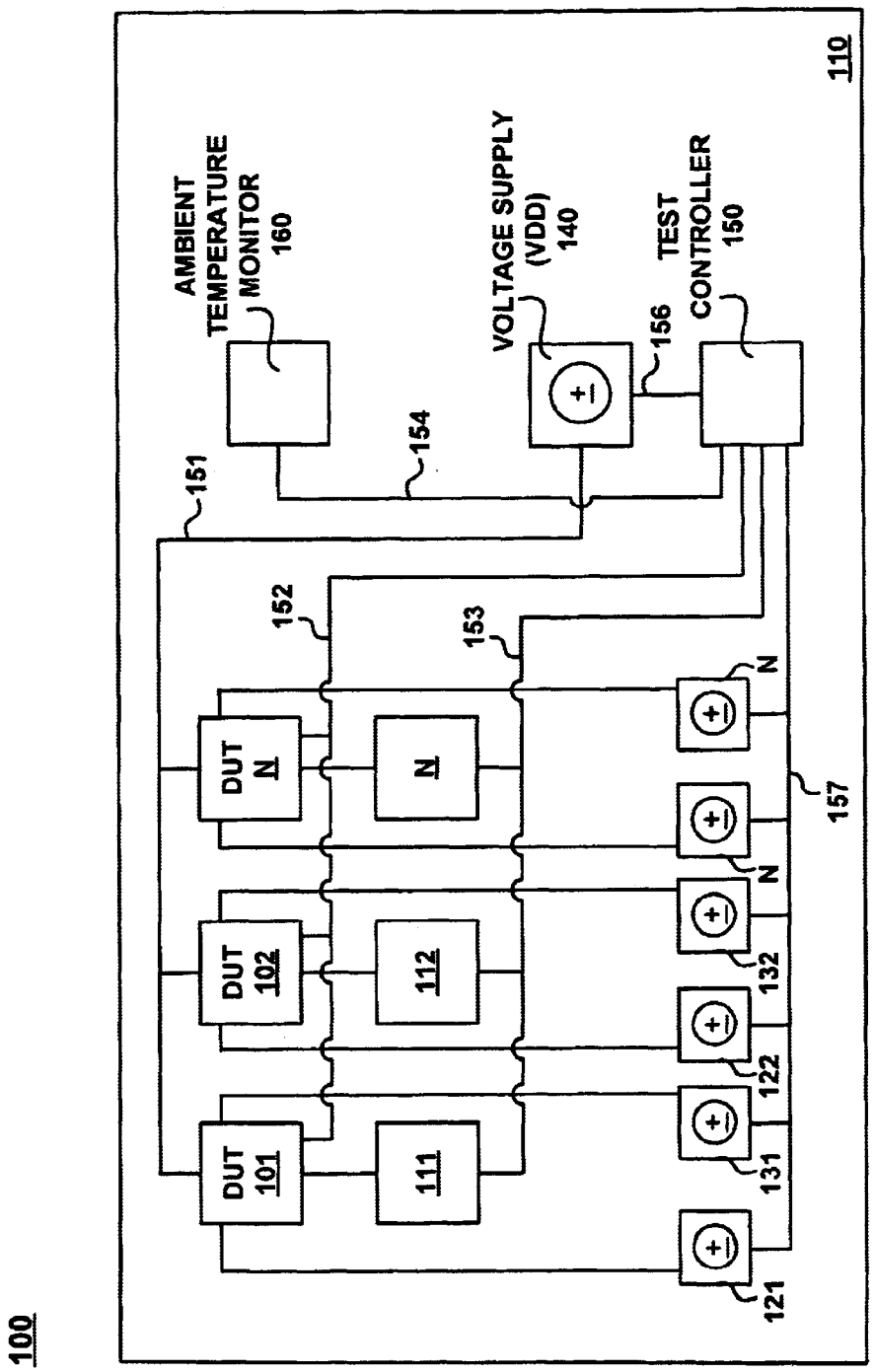
FIG. 2 illustrates an exemplary arrangement of integrated circuit devices configured for a burn-in testing, in accordance with one embodiment of the present invention.

FIG. 2 illustrates an exemplary apparatus 100 including a number of devices under test (DUTs) 101, 102, . . . , N (e.g., integrated circuit devices) configured for a burn-in operation, in accordance with one embodiment of the present invention. In accordance with embodiments of the present invention, the integrated circuit devices 101, 102, . . . , N are exemplified by pFET 50 of FIG. 1. As noted above, the integrated circuit devices 101, 102, . . . , N may instead be nFETs.

The integrated circuits 101, 102, . . . , N of FIG. 2 may be arrayed on a printed wiring board 110, which may include sockets for accepting the integrated circuit devices 101, 102, . . . , N. Because it is desirable to operate the integrated circuit devices under test at an elevated temperature, wiring board 110 is typically placed in a temperature chamber capable of temperature regulation at test temperatures (e.g., 150 degrees Celsius). A typical burn-in test chamber may include a number of wiring boards.

Wiring board 110 includes, for example, wiring traces to conduct electrical signals between various power supplies, test controllers and/or instrumentation, and integrated circuit devices 101, 102, . . . , N under test. In the present embodiment, wiring board 110 includes an operating voltage supply distribution system 151 and a test control distribution system 152. It is appreciated that the distribution systems 151 and 152 can be configured using bus, point-to-point, individual topologies, or the like.

Test control distribution system 152 couples test controller 150 and the integrated circuit devices 101, 102, . . . , N under test, and delivers signals from the test controller 150 to the integrated circuit devices 101, 102, . . . , N under test. As will be discussed in more detail below, test controller 150 is also coupled to voltage supplies, temperature monitoring devices and an ambient temperature sensor in order to measure and control electrical parameters related to power consumption and temperature of the integrated circuit devices 101, 102, . . . , N under test.

Test controller 150 can be located on wiring board 110. However, due to various factors (e.g., the physical size and/or nature of equipment used to implement test controller 150), embodiments in accordance with the present invention are well-suited to situating test controller 150 components elsewhere within a test environment (e.g., on a separate wiring board coupled to wiring board 110, or outside of the thermal test chamber). For example, if test controller 150 were implemented as a workstation computer, it would generally be impractical to place such a workstation in a thermal test chamber due to its size and operating temperature limits.

A test unit controller, which may or may not be apart of test controller 150, can be used to stimulate the integrated circuit devices 101, 102, . . . , N under test with a test pattern sequence and/or test commands and to access a result. Embodiments in accordance with the present invention are well-suited to a wide variety of test unit controllers and testing methods, including, for example, Joint Test Action Group (JTAG) boundary scan and array built-in self test (ABIST).

Operating voltage supply distribution system 151 couples operating voltage supply 140 and the integrated circuit devices 101, 102, . . . , N under test. Operating voltage supply 140 provides voltage (Vdd) and current to operate the integrated circuit devices 101, 102, . . . , N under test. In the present embodiment, operating supply voltage supply 140 is also coupled to test controller 150 by, for example, a bus 156, so that operating supply voltage supply 140 can receive controlling signals from test controller 150.

In the present embodiment, each of the integrated circuit devices 101, 102, . . . , N under test is coupled to a respective positive body bias voltage generator 121, 122, . . . , N. Positive body bias voltage generators 121, 122, . . . , N provide a positive body biasing voltage to n-type wells disposed beneath pFET devices in the integrated circuit devices 101, 102, . . . , N under test. Such body biasing enables adjustment of threshold voltages of the pFET devices, for example, to reduce leakage current of the pFET devices. In one embodiment, the body bias voltage provided by generators 121, 122, . . . , N is in the range of approximately zero to five volts. In the present embodiment, positive body bias voltage generators 121, 122, . . . , N are also coupled to test controller 150 by, for example, a bus 157, so that the body bias voltage generators can receive control signals from test controller 150.

In a similar manner, each of the integrated circuit devices 101, 102, . . . , N under test is coupled to a respective negative body bias voltage generator 131, 132, . . . , N. Negative body bias voltage generators 131, 132, . . . , N provide a negative body biasing voltage to p-type wells disposed beneath nFET devices in the integrated circuit devices 101, 102, . . . , N under test. Such body biasing enables adjustment of threshold voltages of the nFET devices, for example, to reduce leakage current of the nFET devices. In one embodiment, the body bias voltage provided by generators 131, 132, . . . , N is in the range of approximately zero to minus ten volts. In the present embodiment, negative body bias voltage generators 131, 132, . . . , N are also coupled to test controller 150 by, for example, a bus 157, so that the body bias voltage generators can receive control signals from test controller 150.

It is appreciated that the positive body bias generators 121, 122, . . . , N and the negative body bias voltage generators 131, 132, . . . , N may be located on wiring board 110, or they may be located off of wiring board 110, in accordance with embodiments of the present invention.

In general, body bias voltage generators 121, 122, . . . , N and 131, 132, . . . , N are variable voltage sources. Their output voltage can be set (within a range) to a specific value. It is desirable, but not required, that such specific values be set digitally (e.g., by a command from test controller 150). Body biasing currents are typically on the order of low micro-amps per integrated circuit. Consequently, bias voltage generators 121, 122, . . . , N and 131, 132, . . . , N can be relatively small and inexpensive voltage sources.

In the present embodiment, the apparatus 100 also includes an ambient temperature monitor 160 that measures ambient temperature within the test chamber. Ambient temperature measurements are reported back to test controller 150 via bus 154, for example. Apparatus 100 can include more than one ambient temperature monitor.

Continuing with reference to FIG. 2, each of the integrated circuit devices 101, 102, . . . , N under test is coupled to a respective temperature monitor 111, 112, . . . , N. The temperature monitors 111, 112, . . . , N measure temperature at a respective integrated circuit device 101, 102, . . . , N under test. The temperature measurements are reported back to test controller 150 via bus 153, for example.

Figure 3:
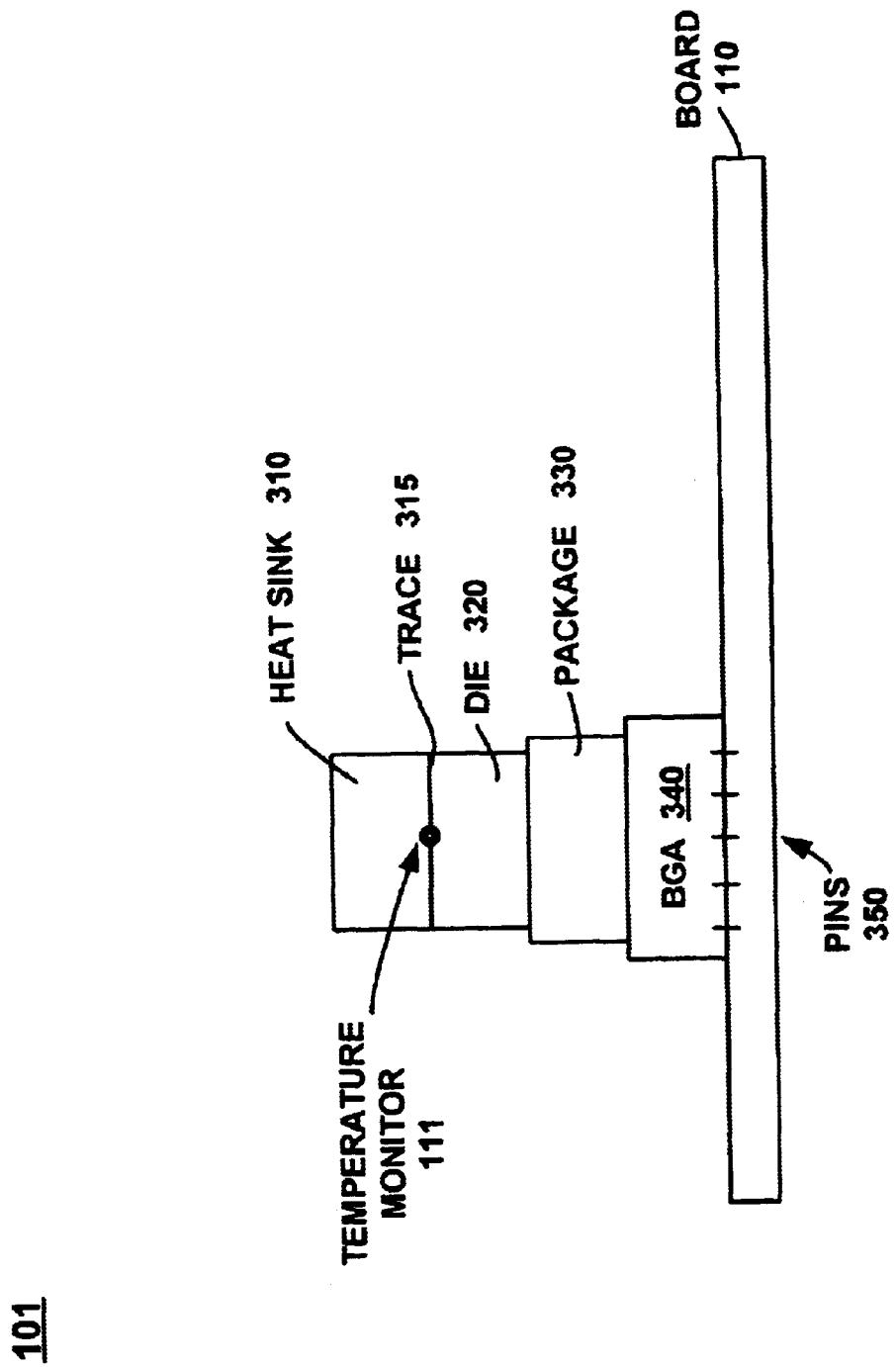
FIG. 3 is a cross-sectional side view of an integrated circuit device configured for burn-in testing, in accordance with one embodiment of the present invention.

FIG. 3 is a cross-sectional side view of an integrated circuit device 101 configured for burn-in testing, in accordance with one embodiment of the present invention. FIG. 3 shows the integrated circuit device 101 connected to wiring board 110 by a number of pins 350. In the present embodiment, the integrated circuit device 101 includes a ball grid array (BGA) 340, a package 330, a die 320, and a heat sink 310. It is appreciated that the elements comprising integrated circuit device 101 are exemplary only, and the present invention is not limited to use with the integrated circuit exemplified by FIG. 3.

In the present embodiment, temperature monitor 111 is situated between the heat sink 310 and the die 320. Temperature monitor 111 can be a thermocouple, for example. Temperature monitor 111 is connected to a trace 315 that in turn may be connected to, or may represent a portion of, the bus 153 of FIG. 2.

The temperature measured at an integrated circuit device under test is referred to herein as "junction temperature." In the example of FIG. 3, the junction temperature refers to the temperature at the die 320.

Referring to FIG. 2, the junction temperature ($T_{junction}$) of an integrated circuit device 101, 102, . . . , N under test can be approximated according to the following relationship:

$$T_{junction} = T_{ambient} + P\theta_i;\qquad[1]$$

where $T_{ambient}$ is the ambient temperature measured by ambient temperature monitor 160; P is the power consumed by the integrated circuit device; and $\theta_i$ is the thermal resistance of the integrated circuit device (e.g., the thermal resistance associated with the transfer of heat from die 320 of FIG. 3 to the surrounding air).

The power consumed (P) is a function of both the operating voltage supplied to the integrated circuit, as well as the body biasing voltage applied to the integrated circuit. According to the embodiments of the present invention, $\theta_i$ can be treated as a constant for all of the integrated circuit devices 101, 102, . . . , N under test because, as will be seen, power consumption P can be adjusted so that the junction temperature is essentially the same for all of the integrated circuit devices 101, 102, . . . , N under test.

The apparatus 100 of FIG. 2 is now described in operation according to one embodiment of the present invention. In overview, power consumption (P in equation [1]) of an integrated circuit can be adjusted by adjusting the threshold voltage of the integrated circuit, even if the operating voltage of the integrated circuit is held constant. Threshold voltage can be adjusted by adjusting the body bias voltage supplied to body biasing wells disposed beneath active semiconductors of the integrated circuit. Adjusting the threshold voltage of the integrated circuit can increase or decrease the leakage current of the integrated circuit, which is a significant component of an integrated circuits power consumption P, especially during low frequency operation, for example, during a burn-in process. Thus, controlling the leakage current provides control over power consumption, and controlling body biasing voltage controls leakage current.

In accordance with an embodiment of the present invention, as illustrated by equation [1] above, the junction temperature ($T_{junction}$) of an integrated circuit under test can be controlled by controlling the power consumed (P) by the integrated circuit when ambient temperature ($T_{ambient}$) and thermal resistance ($\theta_i$) are essentially constant. The power consumed (P) by the integrated circuit operating at a fixed operating voltage can be controlled by adjusting the body biasing voltage applied to the integrated circuit.

Referring to FIG. 2, a particular junction temperature (e.g., 150 degrees Celsius) is selected for burn-in testing. The ambient temperature of the thermal test chamber can also be specified. The thermal resistance ($\theta_i$) associated with each of the integrated circuit devices 101, 102, . . . , N under test is also a known quantity, at least to a satisfactory approximation. Also, the voltage supplied by operating voltage supply 140 is known. Using this information, an initial value of the magnitude of body bias voltage to be applied at the beginning of testing to each of the integrated circuit devices 101, 102, . . . , N under test can be approximated.

However, because the temperature at each of the integrated circuit devices 101, 102, . . . , N under test is separately monitored using temperature monitors 111, 112, . . . , N, it is not necessary to determine a magnitude of body bias voltage to be initially applied to the devices under test. Instead, the magnitude of the body bias voltage to be applied can be determined empirically by measuring junction temperature, and then by adjusting the body bias voltage to achieve the junction temperature desired for burn-in testing.

After the burn-in test operation has begun, the junction temperature at each of the integrated circuit devices 101, 102, . . . , N under test is monitored. If any of the devices under test experiences a junction temperature that is different from that desired for burn-in testing, the body bias voltage of the device under test can be adjusted (increased or decreased) until the junction temperature returns to the desired value. In the present embodiment, the integrated circuit devices 101, 102, . . . , N are each associated with a respective positive body bias voltage generator 121, 122, . . . , N and negative body bias voltage generator 131, 132, . . . , N, and so the body bias voltage applied to one device under test can be adjusted without affecting the body bias voltages applied to the other devices under test.

The body bias voltage applied to each of the integrated circuit devices 101, 102, . . . , N under test can be adjusted automatically by test controller 150 based on feedback from the temperature monitors, or it can be adjusted manually.

Thus, the junction temperature at each of the integrated circuit devices 101, 102, . . . , N under test can be individually controlled by controlling the body bias voltage applied to each device. In this manner, variability from one device under test to another can be managed so that each device is subject to the same test temperature.

For instance, the ambient temperature within the test chamber may not be uniform, so that some devices under test are subject to a higher ambient temperature than others. Should this occur, it will be reflected in the measurement of junction temperature, because junction temperature is a function of ambient temperature (refer to equation [1] above). Accordingly, the junction temperature of devices in a higher temperature region of the test chamber can be adjusted by adjusting the body bias voltage applied to those devices, until their respective junction temperatures reach the desired test temperature.

In a similar manner, variations in heat sink performance from one device under test to another can be accounted for. There may be other variables that affect junction temperature and can introduce variability between the various devices under test. In general, by applying different back bias voltages to the different devices under test as needed, the variability from one device to the next can be reduced so that each device under test is subject to essentially the same burn-in test temperature.

In addition, body bias voltages can be adjusted over the course of the burn-in test to account for changes in test conditions that may occur over time. For instance, as the test chamber begins to heat up, body bias voltages can be adjusted to not only maintain the desired junction temperature, but also to control ambient temperature within an acceptable limit.

Figure 4:
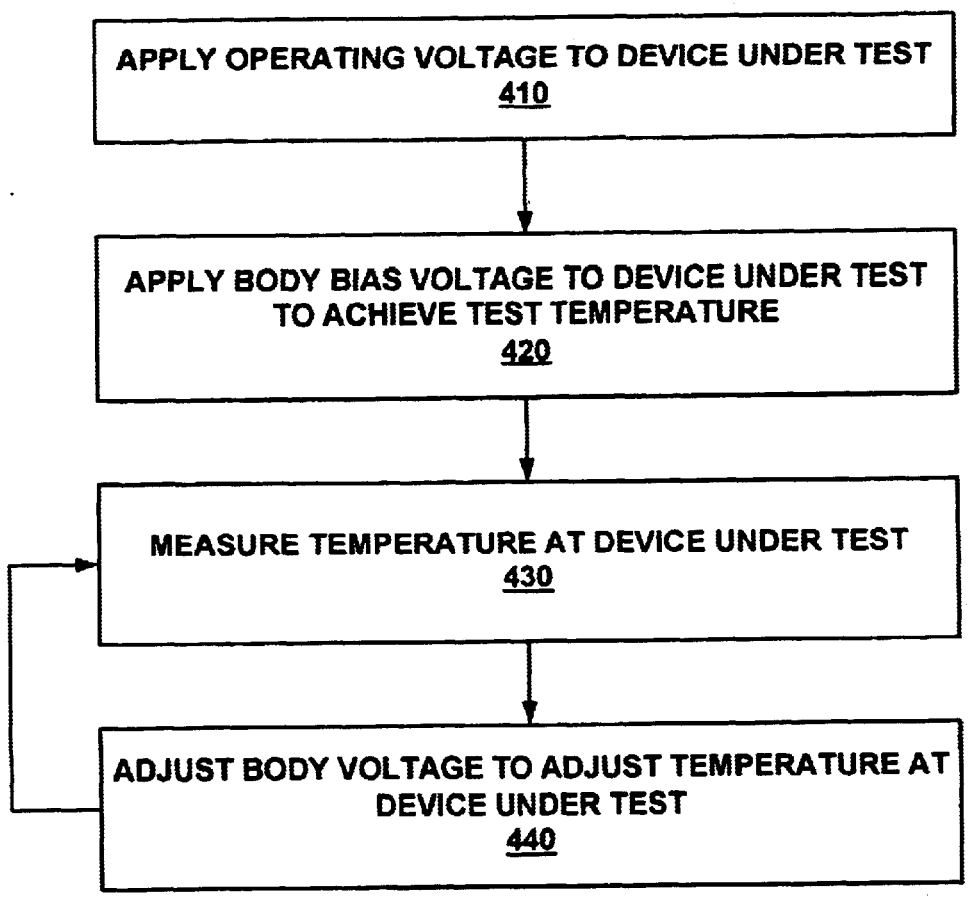
FIG. 4 is a flowchart of a method for controlling temperature during burn-in testing in accordance with one embodiment of the present invention.

FIG. 4 is a flowchart 400 of a method for controlling temperature during burn-in testing in accordance with one embodiment of the present invention. Although specific steps are disclosed in flowchart 400, such steps are exemplary. That is, the present invention is well suited to performing various other steps or variations of the steps recited in flowchart 400. It is appreciated that the steps in flowchart 400 may be performed in an order different than presented.

In block 410 of FIG. 4, an operating voltage is applied to a device under test.

In block 420, a body bias voltage is applied to the device under test. The magnitude of the body bias voltage is selected so that a particular test temperature is achieved at the device under test. In one embodiment, the device under test includes a positive-channel metal-oxide semiconductor (PMOS) device, and the body bias voltage is in the range of approximately zero to five volts. In another embodiment, the device under test includes a negative-channel metal-oxide semiconductor (NMOS) device, and the body bias voltage is in the range of approximately zero to minus ten volts.

In block 430, the temperature at the device under test (e.g., the junction temperature) is measured.

In block 440, the magnitude of the body bias voltage applied to the device under test is adjusted if necessary, and by a necessary amount in order to maintain the desired test temperature (e.g., junction temperature) at the device under test. Flowchart 400 then returns to block 430. In this manner, temperature is continuously measured during burn-in and the body bias voltage is adjusted to maintain the correct junction temperature over the duration of the burn-in.

For instance, with reference to FIG. 2, integrated circuit device under test 101 receives a operating voltage supplied by voltage supply 140. Integrated circuit device under test 101 also receives a body bias voltage from either positive body bias voltage generator 121 (if device 101 is an NFET device) or negative body bias voltage generator 131 (if device 101 is a PFET device). The temperature at integrated circuit device under test 101 is measured using temperature monitor 111. The temperature at integrated circuit device under test 101 is provided to test controller 150. If the temperature at integrated circuit device under test 101 is less than or more than the desired test temperature, test controller 150 can adjust the body bias voltage provided to the device by either positive body bias voltage generator 121 or negative body bias voltage generator 131. Similarly, if the temperature measured by ambient temperature monitor 160 increases, then test controller 150 can adjust the body bias voltage provided to the integrated circuit device under test 101 by either positive body bias voltage generator 121 or negative body bias voltage generator 131 to maintain the desired test temperature at the device.

In summary, embodiments of the present invention provide systems and methods for controlling temperature during burn-in, so that all devices experience essentially the same temperature during burn-in. Thus, all devices under test can be subject to essentially the same test conditions. Consequently, one source of uncertainty that would otherwise be introduced into the test results is eliminated.

Although described for testing in which all devices under test are subject to essentially the same test temperature, it is appreciated that embodiments of the present invention can also be used to test devices under a range of temperatures at the same time. For example, by subjecting the various devices under test to different body bias voltages, some devices can be tested at one junction temperature while other devices are tested at another junction temperature.

In addition, although described for testing in which the devices under test are subject to a test temperature that remains essentially constant during the burn-in operation, it is appreciated that embodiments of the present invention can also be used to vary temperature during testing. For example, by varying body bias voltage during burn-in in a controlled manner, the junction temperature during burn-in is also varied in a controlled manner.

Embodiments in accordance with the present invention, system and method for controlling temperature during burn-in, are thus described. While the present invention has been described in particular embodiments, it should be appreciated that the present invention should not be construed as limited by such embodiments, but rather construed according to the below claims.

What is claimed is:

1. An apparatus for burn-in testing comprising:
   a device under test adapted to receive a body bias voltage;
   a voltage supply for providing said body bias voltage to said device under test; and
   a wiring board for coupling said device under test and said voltage supply, wherein said device under test is subject to a burn-in test temperature that is regulated by adjusting said body bias voltage.

2. The apparatus of claim 1 wherein said body bias voltage is selected to achieve a particular test temperature measured at said device under test.

3. The apparatus of claim 1 further comprising a test controller coupled to said device under test via said wiring board.

4. The apparatus of claim 1 further comprising a second voltage supply for providing an operating voltage to said device under test.

5. The apparatus of claim 1 wherein said device under test comprises a positive-channel metal-oxide semiconductor (PMOS) device.

6. The apparatus of claim 5 wherein said body bias voltage is in the range of approximately zero to five volts.

7. The apparatus of claim 1 wherein said device under test comprises a negative-channel metal-oxide semiconductor (NMOS) device.

8. The apparatus of claim 7 wherein said body bias voltage is in the range of approximately zero to minus ten volts.

9. A method of burn-in testing of a device under test, said method comprising:
   applying an operating voltage to said device under test;
   applying a body bias voltage to said device under test, wherein said body bias voltage is selected to achieve a particular test temperature measured at said device under test; and
   measuring temperature at said device under test.

10. The method of claim 9 further comprising adjusting said body bias voltage to adjust temperature at said device under test.

11. The method of claim 9 wherein said device under test comprises a positive-channel metal-oxide semiconductor (PMOS) device.

12. The method of claim 11 wherein said body bias voltage is in the range of approximately zero to five volts.

13. The method of claim 9 wherein said devices under test comprises a negative-channel metal-oxide semiconductor (NMOS) device.

14. The method of claim 13 wherein said body bias voltage is in the range of approximately zero to minus ten volts.

15. An apparatus for burn-in testing comprising:
   a plurality of devices under test, each device under test adapted to receive a body bias voltage, wherein the temperature at each device under test is monitored;
   a voltage supply for providing body bias voltages applied to said devices under test; and
   a wiring board comprising circuitry that individually couples each device under test to said voltage supply such that each device under test can receive a different body bias voltage, wherein a body bias voltage applied to a device under test is selected to achieve a particular test temperature measured at said device under test.

16. The apparatus of claim 15 further comprising a test controller coupled to said device under test via said wiring board.

17. The apparatus of claim 15 further comprising a voltage supply for providing an operating voltage to said devices under test.

18. The apparatus of claim 15 wherein said devices under test comprises positive-channel metal-oxide semiconductor (PMOS) devices.

19. The apparatus of claim 18 wherein said body bias of approximately zero to five volts.

20. The apparatus of claim 18 wherein said devices under test comprises negative-channel metal-oxide semiconductor (NMOS) devices.

21. The apparatus of claim 20 wherein said body bias voltages are in the range of approximately zero to minus ten volts.

* * * * *